(12) United States Patent
Myers

(10) Patent No.: US 9,479,142 B1
(45) Date of Patent: Oct. 25, 2016

(54) PHASE ERROR COMPENSATION CIRCUIT

(71) Applicant: Linear Technology Corporation, Milpitas, CA (US)

(72) Inventor: John Perry Myers, Fremont, CA (US)

(73) Assignee: Linear Technology Corporation, Milpitas, CA (US)

(*) Notice: Subject to any disclaimer, the term of this patent is extended or adjusted under 35 U.S.C. 154(b) by 0 days.

(21) Appl. No.: 14/806,478

(22) Filed: Jul. 22, 2015

Related U.S. Application Data

(60) Provisional application No. 62/120,717, filed on Feb. 25, 2015.

(51) Int. Cl.
| | |
|---|---|
| *H03K 5/13* | (2014.01) |
| *H03H 11/18* | (2006.01) |
| *H03K 5/02* | (2006.01) |
| *H03K 5/26* | (2006.01) |
| *H03H 11/22* | (2006.01) |
| *H03K 5/00* | (2006.01) |

(52) U.S. Cl.
CPC .............. *H03H 11/18* (2013.01); *H03H 11/22* (2013.01); *H03K 5/02* (2013.01); *H03K 5/26* (2013.01); *H03K 2005/00286* (2013.01)

(58) Field of Classification Search
CPC ........ H03K 5/13; H03K 5/131; H03K 5/133; H03K 5/134; H03K 5/135; H03K 5/14; H03K 5/145; H03F 1/301; H03F 1/302; H03F 1/3211; H03F 3/45179; H03F 3/45183; H03F 3/45475

USPC .......................... 327/103, 115, 117, 233, 238
See application file for complete search history.

(56) References Cited

U.S. PATENT DOCUMENTS

| | | | |
|---|---|---|---|
| 6,016,422 A | 1/2000 | Bartusiak | |
| 7,298,222 B2 | 11/2007 | Rosik et al. | |
| 7,474,715 B1 | 1/2009 | Ni et al. | |
| 7,742,545 B2 | 6/2010 | Salvi et al. | |
| 8,248,132 B2* | 8/2012 | Chang | H03B 27/00 327/238 |
| 2003/0189449 A1* | 10/2003 | Zhang | H03K 3/012 327/115 |
| 2012/0120992 A1 | 5/2012 | Soltanian et al. | |

* cited by examiner

*Primary Examiner* — John Poos
(74) *Attorney, Agent, or Firm* — Han Santos Reich, PLLC

(57) ABSTRACT

A method and system of compensating for phase error. A phase error compensation circuit is configured to generate a phase-corrected quadrature Q output signal and a corresponding phase-corrected in-phase I output signal, the circuit includes a first transconductance circuit configured to convert a voltage signal related to an I input voltage signal to an I current signal. A second transconductance circuit is configured to convert a voltage signal related to a Q input signal to a Q current signal. A first multiplier circuit is configured to multiply the Q current signal times a Q scaling constant. A second multiplier circuit is configured to multiply the I current signal times an I scaling constant. An I summer sums the I current signal with the scaled Q signal. A Q summer sums the Q current signal with the scaled I signal.

20 Claims, 2 Drawing Sheets

PHASE ERROR COMPENSATION CIRCUIT

CROSS REFERENCES TO RELATED APPLICATIONS

The present application claims the benefit of priority under 35 U.S.C. §119 from U.S. Provisional Patent Application Ser. No. 62/120,717, entitled "Phase Error Compensation Circuit," filed on Feb. 25, 2015, which is hereby incorporated by reference in its entirety for all purposes.

BACKGROUND

1. Technical Field

This disclosure generally relates to correcting a phase error between in-phase and quadrature component signals.

2. Description of Related Art

Wireless communication systems often use quadrature phase generators for a variety of modulation and demodulation purposes. For example, it is often desirable to generate a quadrature phase local oscillator (LO) signal for either the down-conversion of a received signal or the up-conversion of a signal to be transmitted. In an ideal system, the quadrature LO signal includes a quadrature component (Q) that leads an in-phase component (I) in phase by exactly 90°. However, due to device mismatches, tolerances, layout parasitics, and other sources, signal paths for the I and Q signals may have different propagation delays. Consequently, there is a phase error component between the I and Q signals. Thus, quadrature LO generation circuits may have small errors from the perfect 90° phase quadrature. Any variation from the ideal quadrature phase difference of 90° at the outputs of the quadrature phase generator is regarded as a relative phase error between the I and Q signals. This phase error can reduce the image rejection and, if not corrected, may ultimately degrade transceiver performance.

There are several known ways of correcting phase error. For example, U.S. Pat. No. 6,016,422 ("'422") uses a current controlled phase shifter in each path, thereby creating two independent paths, one for the in-phase signal and one for the quadrature signal. Because they are independent, they are subject to mismatches in layout parasitics and process parameters. Each phase shifter uses a fixed capacitor and a fixed resistor architecture. By changing the bias current in the "variable current controller" 809, the emitter resistance is changed allowing the "variable phase shift network 420" to "maintain phase quadrature over a 2:1 range of input frequencies." However, in order to provide a consistent phase shift over a range of LO frequencies for a given control current, the resistor and capacitor may need to be scaled with frequency.

In U.S. Pat. No. 7,474,715 ("'715"), a variable capacitive load is applied to the I and Q LO signals to shift the phase. Similar to '422, the '715 patent may also need to be scaled with frequency in order to provide a consistent operation over frequency.

U.S. Pre-Grant Patent Publication 2012/0120992, U.S. Pat. Nos. 7,742,545, and 7,298,222 all use delay elements in each I and Q LO path to adjust the phase. These references are sensitive to frequency, because, for a given phase shift at a low frequency, a longer delay may need to be used than at a higher frequency, to obtain the same phase shift. It is with respect to these considerations and others that the present disclosure has been written.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The various methods and circuits disclosed herein relate to correcting a phase error between in-phase and quadrature component signals, I and Q. In one aspect, the circuits discussed herein can correct for phase errors at high frequencies and may be used, for example, in local oscillator (LO) generation circuits. In one aspect, the phase error compensation circuit uses the I and Q LO signals to provide phase shifted signals. Advantageously, the circuits discussed herein do not require any capacitive loading or R-C and gate transmission delays to correct the relative phase error.

Figure 1:
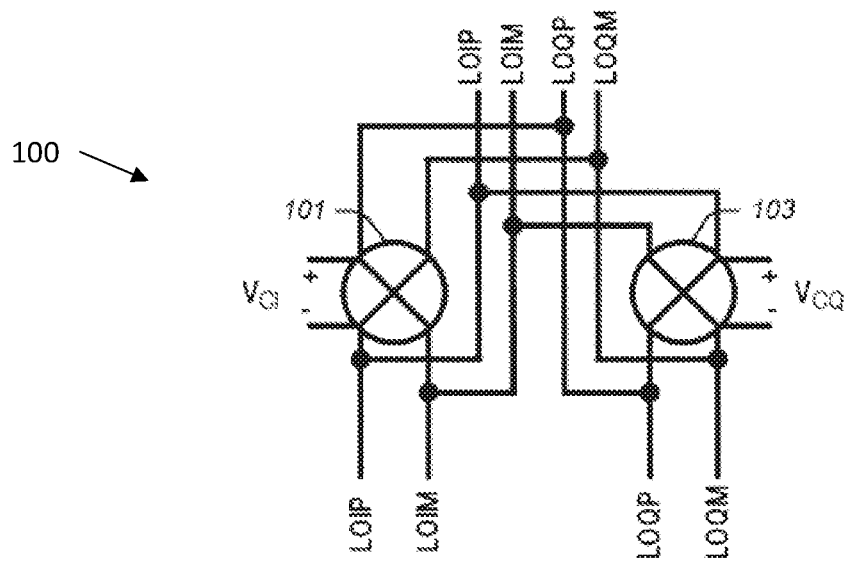
FIG. 1 is a block diagram of an example of a phase error compensation circuit.

FIG. 1 is a block diagram of a phase error compensation circuit, consistent with an exemplary embodiment. Circuit 100 includes multiplier circuits 101 and 103. Complimentary local oscillator LOIP and LOIM signals may be received for the I signal and complementary local oscillator LOQP and LOQM may be received for the Q signal. $V_{CI}$ and $V_{CQ}$ may be DC voltages that represent an amount of phase correction for the I and Q signals, respectively. In one embodiment, the LOIP/LOIM and LOQP/LOQM signals are pairs of differential signals.

The operation of circuit 100 may be understood by reference to the following trigonometric identities for angle sum and difference. If there are two (e.g., differential) input signals, then the difference is provided by the equations below:

$$LOI = LOIP - LOIM = \cos(\omega t) \text{ and,} \qquad \text{Eq. 1a}$$

$$LOQ = LOQP - LOQM = \sin(\omega t) \qquad \text{Eq. 1b}$$

In this regard, a small phase shift, $\phi$, to the LOI signal may be expressed as follows:

$$LOI = LOIP - LOIM = \cos(\omega t + \phi) \qquad \text{Eq. 1c}$$

Using a trigonometric identity, the above expression can be written as provided in equation 2 below:

$$\cos(\omega t + \phi) = \cos(\omega t)\cos(\phi) - \sin(\omega t)\sin(\phi) \qquad \text{Eq. 2}$$

For a small phase shift, (e.g., in the range of +10° to −10°), cos(ϕ)≈1. Substituting A=sin(ϕ), Eq. 2 may be rewritten as provided in equation 3 below:

$$\cos(\omega t+\phi)=\cos(\omega t)-A\sin(\omega t) \quad \text{Eq. 3}$$

Eq. 3 provides that a small phase shift to LOI can be accomplished by subtracting a scaled amount of LOQ from LOI, where the phase shift ϕ is given approximately by arcsine(A). A similar operation can be performed for a phase shift to LOQ by adding a scaled amount of LOI to LOQ.

Figure 2:
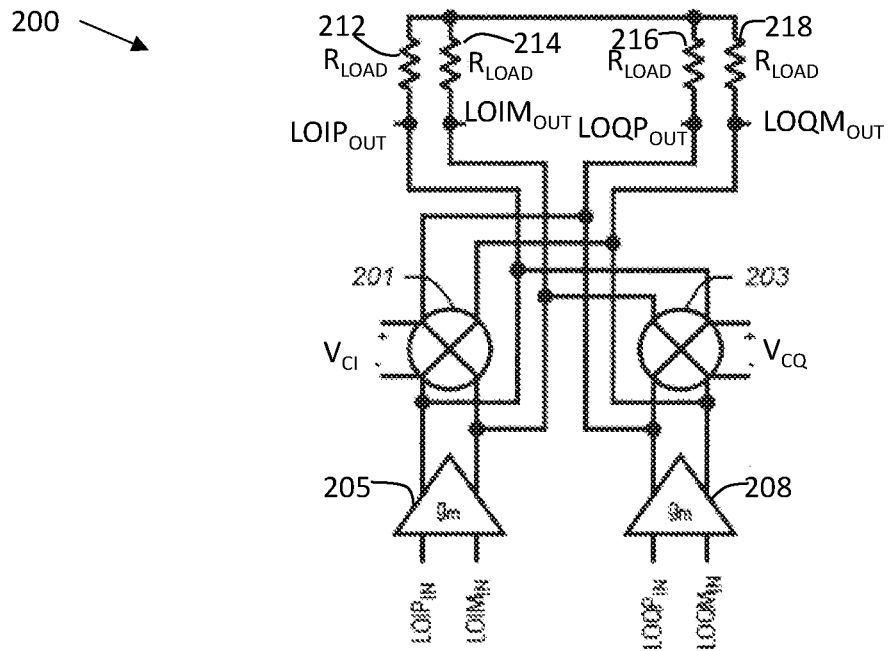
FIG. 2 is a block diagram of an example of a phase error compensation circuit that includes transconductance circuits and loads.

FIG. 2 is a block diagram of an example of a phase error compensation circuit that includes multiplier circuits 201 and 203, transconductance circuits (amplifiers) $g_m$, 205 and 208, respectively, and resistances $R_{LOAD}$ 212, 214, 216, and 218, respectively. The exemplary embodiment of FIG. 2 illustrates a practical implementation, where the input signals are differential voltage pairs and are first applied to the transconductance amplifiers $g_m$ 205 and 208, respectively, to change the input I and Q voltage signals into corresponding current signals.

Circuit 200 is a phase error compensation circuit, consistent with an exemplary embodiment. It includes a first transconductance gm circuit (e.g., an amplifier) 205 having (i) a differential input configured to receive input signals $LOIP_{IN}$ and $LOIM_{IN}$, and (ii) a differential output. There is a second transconductance gm circuit 208 having (i) a differential input configured to receive input signals $LOQP_{IN}$ and $LOQM_{IN}$, and (ii) a differential output. Thus, the phase error compensation circuit 200 may include a transconductance amplifier 208 for the Q signal and a transconductance amplifier 205 for the I signal that change the I and Q signals from a varying voltage to a varying current that is proportional to the varying voltage.

Circuit 200 includes a first multiplier circuit 201 and a second multiplier circuit 203. By way of example, circuit 200 illustrates a first multiplier circuit 201 having a differential input configured to receive a differential control signal $V_{CI}$. The first multiplier circuit 201 includes a second differential input coupled to the differential output of the first transconductance circuit 205 and the differential output of the second multiplier circuit 203. The first multiplier circuit 201 includes a differential output coupled to the differential output of the second transconductance circuit 208.

Similarly, the second multiplier circuit 203 comprises a differential input configured to receive a differential control signal $V_{CQ}$. The second multiplier circuit 203 includes a second differential input coupled to the differential output of the second transconductance circuit 208 and the differential output of the first multiplier circuit 201. The second multiplier circuit 203 includes a differential output coupled to the differential output of the first transconductance circuit 205.

Accordingly, a portion of output signal current from each transconductance amplifier 205, 208, may pass through its corresponding multiplier circuit 201, 203, respectively. In one embodiment, each multiplier circuit may be configured as a current attenuator.

Circuit 200 includes a first differential load $R_{LOAD}$ 212, 214 and a second differential load $R_{LOAD}$ 216, 218, all differential nodes sharing a common node that is set at a suitable voltage level (e.g., $V_{CC}$, $V_{DD}$, gnd., etc.). The first differential load comprises a first load 212 and a second load 214, each receiving one component of the differential output $LOIP_{OUT}$ and $LOIM_{OUT}$ of the second multiplier circuit 203. Similarly, the second differential load comprises a first load 216 and a second load 218, each receiving one component of the differential output $LOQP_{OUT}$ and $LOQM_{OUT}$ of the first multiplier circuit 201.

Accordingly, in the example of circuit 200, the outputs of the multipliers 201, 203 (e.g., current attenuators) are combined at least in part with the output signal from the transconductance circuits 205, 208. In this regard, the differential loads (i.e., $R_{LOAD}$ 212 with $R_{LOAD}$ 214; and $R_{LOAD}$ 216 with $R_{LOAD}$ 218) perform a summing operation, combining the output signal from the transconductance circuits with the output signals of the multiplier circuits. The summing operation is discussed in more detail later in the context of FIG. 3.

Thus, the phase error compensation circuit discussed herein generates a phase-corrected quadrature Q signal and a corresponding phase-corrected in-phase I signal. The phase error compensation circuit 200 may include an I multiplier circuit 201 that multiplies the I signal provided by the first transconductance circuit 205, times an I scaling constant provided by the input signal $V_{CI}$. There is a Q multiplier circuit 203 that multiplies the Q signal provided by the second transconductance circuit 208, times a Q scaling constant provided by the input signal $V_{CQ}$.

The circuit 200 may also include an I summer (e.g., provided by $R_{LOAD}$ 212, 214) that sums the I signal with the scaled Q signal, and a Q summer (e.g., provided by $R_{LOAD}$ 216, 218) that sums the Q signal with the scaled I signal. In one embodiment, each scaling constant (i.e., for I and Q) may be substantially less than one.

In one embodiment, the phase error compensation circuit is configured to generate the phase-corrected Q and I signals to a frequency of 10 GHz or higher depending on process technology and transistor speed. Each multiplier circuit 201 and 203 may include at least one pair of transistors that have different emitter areas. As illustrated in circuit 200, the I and Q signals may each be differential signals and the multipliers and loads (e.g., summers) may each be configured to operate on differential signals.

Figure 3:
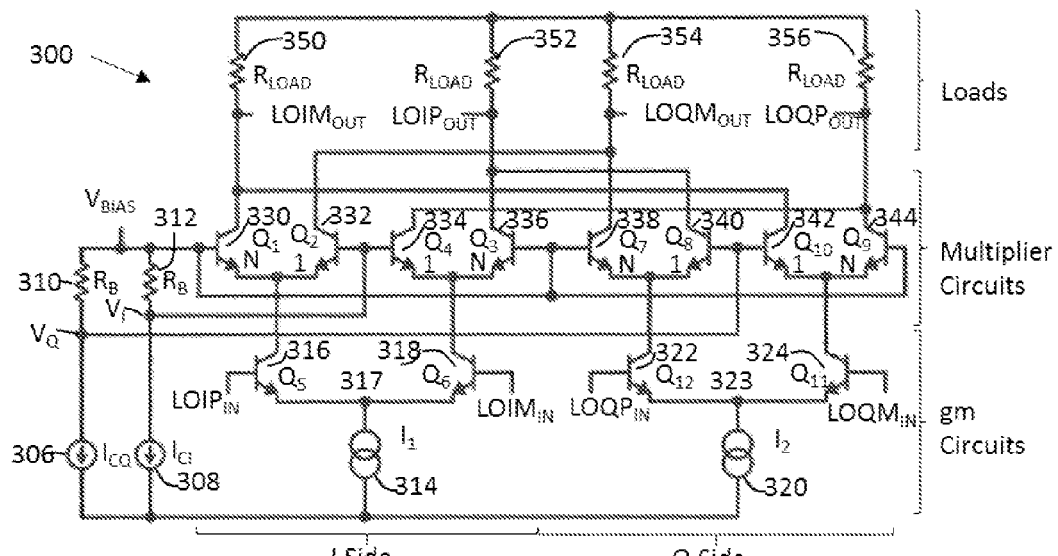
FIG. 3 is a transistor level schematic of an example of a phase error compensation circuit.

FIG. 3 illustrates a transistor level schematic of a phase error compensation circuit 300, consistent with an exemplary embodiment. Circuit 300 includes an "I side" and a "Q side," which are mutually similar. Accordingly, aspects of circuit 300 will be discussed in the context of the "I side" and not repeated for the "Q side," for brevity.

By way of example, circuit 300 illustrates a first transconductance circuit 205 of FIG. 2 (i.e., on the "I side" of FIG. 3), comprising two transistors Q5 (316) and Q6 (318) having a common node (i.e., emitter) coupled to a current source 314. The differential outputs (i.e., collectors) of the two transistors Q5 (316) and Q6 (318) are coupled to their corresponding multiplier circuit. The first transconductance circuit (e.g., amplifier) has a differential input at the base of the transistors Q5 (316) and Q6 (318), wherein the differential input is configured to receive input signals $LOIP_{IN}$ and $LOIM_{IN}$, respectively, in a differential way. Put differently, the transconductance circuit (e.g., amplifier) on the "I side," which is replicated on the "Q side," comprises a differential pair of transistors Q5 (316)/Q6 (318) that is configured to provide a differential output to its corresponding multiplier circuit.

By way of example, FIG. 3 illustrates that each multiplier circuit (elements 201 and 203 in FIG. 2) comprises two pairs of transistors, each pair of transistors sharing a common node that is coupled to an output of its corresponding transconductance circuit.

On the "I side", the first multiplier circuit comprises a first pair of transistors Q1 (330) and Q2 (332) sharing a common emitter that is coupled to transistor Q5 (316) of the first transconductance circuit. The first multiplier circuit further includes a second pair of transistors Q4 (334) and Q3 (336)

sharing a common emitter that is coupled to transistor Q6 (318) of the first transconductance circuit. On the "I side," the ratio of the emitter areas between transistors Q1 (330) and Q2 (332) is N, and the ratio of transistors Q3 (336) to Q4 (334) is N, where N is greater than 1. The ratios of the emitter areas of the multiplier circuit on the "Q side" are similar to the "I side," as illustrated by way of example in circuit 300.

In one embodiment, the control inputs $V_{CI}$ and $V_{CQ}$ of FIGS. 1 and 2 may be provided by applying separate control currents to predetermined loads. To that end, phase error compensation circuit 300 illustrates by way of example a control circuit comprising resistance elements $R_B$ 310 and 312 coupled to corresponding current sources $I_{CQ}$ 306 and $I_{CI}$ 308 and sharing a common node $V_{BIAS}$. The control circuit applies control currents $I_{CI}$ 306 and $I_{CQ}$ 308 to their corresponding series resistances $R_B$ 310, 312, to provide control voltages at nodes $V_Q$ and $V_I$, respectively. Thus, the voltage at node $V_Q$ is applied to the base of transistors Q8 (340) and Q10 (342) on the "Q side" of the phase error compensation circuit 300. The voltage at node Vi is applied to the base of Q2 (332) and Q4 (334).

The bias voltage $V_{BIAS}$ is applied to the base of transistors Q1 (330), Q3 (336), Q7 (338), and Q9 (344). Put differently, the bias voltage $V_{BIAS}$ is applied to the transistors of the multiplier circuits that have an emitter area that is N times their corresponding paired transistor. The bias voltage $V_{BIAS}$ may be set such that the transistors of the multiplier circuits (e.g., current attenuator transistors) are not in saturation.

With the foregoing overview, it may be helpful to provide an example of the operation of the phase error compensation circuit 300. During operation of the "I side" of the circuit 300, if the control current $I_{CI}$ is zero, the voltage difference between the bases of transistors Q2 (332) and Q1 (330), is essentially zero. Similarly, the voltage difference between the bases of transistors Q4 (334) and Q3 (336), is essentially zero. That is because there is no substantial voltage drop across load $R_B$ 312, making the voltage Vi to be substantially similar to $V_{BIAS}$. In this regard, the maximum current split between transistors Q1 (330) and Q2 (332)—as well as the maximum current split between transistors Q3 (336) and Q4 (334)—are governed by the ratio of N (i.e., ratio of the emitter areas of the paired transistors).

Put differently, when the control current $I_{CI}$ (through current source 308) is zero, the current provided by the transconductance circuit on the "I side" is split at its maximum ratio of N, and this fraction of current is routed to the "Q side" to loads $R_{LOAD}$ 354 and 356.

When the control current $I_{CI}$ (through current source 308) times the resistance of load $R_B$ 312 is greater than $5V_T$, where $V_T$ is the transistor thermal voltage (e.g., approximately 26 mV at 300K), most of the current (i.e., provided by its corresponding transconductance circuit) is routed through the transistors Q1 (330) and Q3 (336). That is because transistors Q1 (330) and Q3 (336) are substantially ON while transistors Q2 (332) and Q4 (334) receive a substantially lower voltage at their base nodes and therefore have a much higher resistance path between their collector and emitter, respectively.

Put differently, when the control current $I_{CI}$ (through current source 308) provides sufficient current to provide a predetermined voltage drop across $R_B$ 312, most of the current provided by the transconductance circuit on the "I side" is routed to loads $R_{LOAD}$ 350 and 352, and practically no current is routed to the "Q side" to loads $R_{LOAD}$ 354 and 356.

The operation of the "Q-side" of the circuit 33 in reference to a control current $I_{CQ}$ through current source 306 is similar to that of the "I side" and will therefore not be repeated in detail for brevity. It will be understood that, on the "Q side," when the control current $I_{CQ}$ (through current source 306) provides sufficient current, most of the current provided by the transconductance circuit on the "Q side" is routed to loads $R_{LOAD}$ 354 and 356 on the "Q side". Further, when the control current $I_{CQ}$ is zero, the maximum current split between transistors Q7 (338) and Q8 (340)—as well as the maximum current split between transistors Q9 (344) and Q10 (342)—are governed by the ratio N. Then the current provided by the transconductance circuit on the "Q side" is split at its maximum ratio of N, and this fraction of current is routed to the "I side" to loads $R_{LOAD}$ 350 and 352.

The multiplier circuit on the "I side" (implemented as a current attenuator Q1 (330) and Q2 (332)), is configured to split the current from the transconductance circuit output at the collector of transistor Q5 (316) according to the expression provided in equation 4 below:

$$I_{CQ1}/I_{CQ2}=N\exp(I_{CI}R_B/V_T) \quad \text{Eq. 4}$$

Similarly, transistors Q3 (336) and Q4 (334) on the "I side" may split the current provided at the collector of transistor Q6 (318). On the "Q side" transistors Q7 (338) and Q8 (340) may split the current provided by transistor Q12 (332) from its corresponding transconductance circuit. Transistors Q9 (344) and Q10 (342) may split the current provided at the collector of transistor Q11 (324).

In one embodiment, to obtain a continuous shift in phase versus a control value, the $I_{CI}$ current is held constant while the $I_{CQ}$ current is changed. In another embodiment, the $I_{CQ}$ current is held constant while the $I_{CI}$ current is changed. This feature is illustrated by way of example later in FIG. 4.

Figure 4:
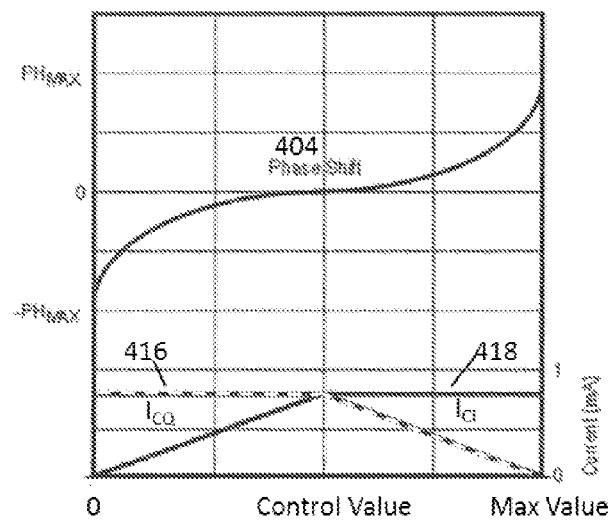
FIG. 4 is a graph illustrating an example of phase shift and control currents versus control value of an example phase error correction circuit.

FIG. 4 is a graph illustrating an example of phase shift and control currents versus a control value of the example phase error correction circuit 300. The $I_{CQ}$ signal is represented by the dotted line 416 and the $I_{CI}$ signal is represented by the solid line 418. By way of example, FIG. 4 illustrates that $I_{CQ}$ current may be held constant at a predetermined suitable value while the $I_{CI}$ current is ramped up. In this regard, the phase is shifted from a negative $PH_{MAX}$ to zero. FIG. 4 also illustrates that the $I_{CI}$ current signal may be held constant at a predetermined suitable value while the $I_{CQ}$ current signal is ramped down (e.g., to zero), thereby achieving a phase shift from zero to positive $PH_{MAX}$. These operations may be performed instead of or in addition to one another to achieve the desired phase shift correction.

In one embodiment, the maximum phase shift correction in degrees is governed by equation 5 below:

$$PH_{MAX}=(180/\pi)\arcsin(1/N) \quad \text{Eq. 5}$$

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently. For example, any signal discussed herein may be scaled, buffered, scaled and buffered, converted to another mode (e.g., voltage, current, charge, time, etc.), or converted to another state (e.g., from HIGH to LOW and LOW to HIGH) without materially changing the underlying control method. Accordingly, it is intended that the invention be limited only in terms of the appended claims.

For example, the NPN transistors of FIG. 3 could be replaced by NMOS transistors for similar circuit operation, except that the attenuator current splitting equation will follow from the device equations of a MOS device rather than a BJT. Further, a PNP may be used instead of an NPN. Even though the "loads" discussed herein are illustrated as resistors, other types of devices that include a resistance, including bipolar and MOS devices, are contemplated as well.

For example, in FIG. 3, the control currents, $I_{CI}$ and $I_{CQ}$, could be impressed upon a diode predistorter load rather than a simple resistance to change the phase shift versus control current response. This may result in a more linear phase shift response versus control current.

For example, in FIG. 3, the control currents, $I_{CI}$ and $I_{CQ}$, may be current sources rather than current sinks as drawn, or may be bipolar in operation, whereby the resulting control voltages, $V_{CI}$ and $V_{CQ}$, may take on positive values to allow for greater maximum phase shift. In this embodiment, the positive voltage value may be defined to be from the bases of Q2 and Q4 to the bases of Q1 and Q3, and also from the bases of Q8 and Q10 to the bases of Q7 and Q9.

Unless otherwise stated, all measurements, values, ratings, positions, magnitudes, sizes, and other specifications that are set forth in this specification, are approximate, not exact. They are intended to have a reasonable range that is consistent with the functions to which they relate and with what is customary in the art to which they pertain.

Except as stated immediately above, nothing that has been stated or illustrated is intended or should be interpreted to cause a dedication of any component, step, feature, object, benefit, advantage, or equivalent to the public, regardless of whether it is or is not recited in the claims.

All articles, patents, patent applications, and other publications that have been cited in this disclosure are incorporated herein by reference.

It will be understood that the terms and expressions used herein have the ordinary meaning as is accorded to such terms and expressions with respect to their corresponding respective areas of inquiry and study except where specific meanings have otherwise been set forth herein. Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A phase error compensation circuit comprising:
   a first transconductance circuit having a differential input and a differential output;
   a second transconductance circuit having a differential input and a differential output;
   a first multiplier circuit comprising:
      a differential control input ($V_{CI}$);
      a second differential input coupled to the differential output of the first transconductance circuit; and
      a differential output;
   a second multiplier circuit comprising:
      a differential control input ($V_{CQ}$);
      a second differential input coupled to the differential output of the second transconductance circuit; and
      a differential output;
   a first differential load comprising a first load and a second load, together having a differential input coupled to the differential output of the second multiplier circuit and sharing a common node; and
   a second differential load comprising a first load and a second load together having a differential input coupled to the differential output of the first multiplier circuit and sharing the common node, wherein the first multiplier circuit is configured to multiply the differential current signal provided by the first transconductance circuit times a first scaling constant provided at the differential control input of the first multiplier circuit.

2. The phase error compensation circuit of claim 1, wherein:
   the first transconductance circuit is configured to convert a differential voltage signal at its differential input to a differential current signal at its differential output; and
   the second transconductance circuit is configured to convert a differential voltage signal at its differential input to a differential current signal at its differential output.

3. The phase error compensation circuit of claim 2, wherein each transconductance circuit comprises two transistors, the two transistors having a common node coupled to current source.

4. The phase error compensation circuit of claim 3, wherein the two transistors of each transconductance circuit are bipolar transistors sharing a common emitter and have their respective collectors coupled to their corresponding multiplier circuit.

5. The phase error compensation circuit of claim 1, wherein the second multiplier circuit is configured to multiply the differential current signal provided by the second transconductance circuit times a second scaling constant provided at the differential control input of the second multiplier circuit.

6. The phase error compensation circuit of claim 5, wherein at least one of (i) the first scaling constant and (ii) the second scaling constant is substantially less than one.

7. The phase error compensation circuit of claim 1, wherein the phase error compensation circuit is configured to generate a phase-corrected Q and I signals at a frequency of at least 1 GHz.

8. The phase error compensation circuit of claim 1, wherein:
   the first multiplier circuit comprises:
      a first pair of transistors having a common node coupled to a first component of the differential output of the first transconductance circuit; and a second pair of transistors having a common node coupled to a second component of the differential output of the first transconductance circuit; and the second multiplier circuit comprises:
a first pair of transistors having a common node coupled to a first component of the differential output of the second transconductance circuit; and
a second pair of transistors having a common node coupled to a second component of the differential output of the second transconductance circuit.

9. The phase error compensation circuit of claim 8, wherein the first and second pair of transistors of each multiplier circuit comprise bipolar transistors having an emitter area ratio of N, where N is greater than 1.

10. A phase error compensation circuit comprising:
a first transconductance circuit having a differential input and a differential output;
a second transconductance circuit having a differential input and a differential output;
a first multiplier circuit comprising:
a differential control input ($V_{CI}$);
a second differential input coupled to the differential output of the first transconductance circuit; and
a differential output;
a second multiplier circuit comprising:
a differential control input ($V_{CQ}$);
a second differential input coupled to the differential output of the second transconductance circuit; and
a differential output;
a first differential load comprising a first load and a second load, together having a differential input coupled to the differential output of the second multiplier circuit and sharing a common node;
a second differential load comprising a first load and a second load together having a differential input coupled to the differential output of the first multiplier circuit and sharing the common node; and a control circuit configured to provide control signals to the differential control input of the first and second multiplier circuit, respectively.

11. The phase error compensation circuit of claim 10, wherein the control circuit comprises:
a first resistance element having a first node and a second node, wherein the first node is coupled to a reference bias voltage node;
a second resistance element having a first node and a second node, wherein the first node is coupled to the reference bias voltage node;
a first current source coupled to the second node of the first resistance element;
a second current source coupled to the second node of the second resistance element.

12. The phase error compensation circuit of claim 11, wherein:
each multiplier circuit comprises a first pair of bipolar transistors and a second pair of bipolar transistors, wherein each pair of bipolar transistors has a common emitter;
each pair of bipolar transistors has a first bipolar transistor that has an emitter are that is N times the emitter area of a second bipolar transistor, where N is greater than 1;
the reference bias voltage node is coupled to a base of each first bipolar transistor of each multiplier circuit;
the second node of the first resistance element of the control circuit is coupled to each second bipolar transistor of the second multiplier circuit; and the second node of the second resistance element of the control circuit is coupled to each second bipolar transistor of the first multiplier circuit.

13. The phase error compensation circuit of claim 1, wherein:
the first differential load is configured to sum at least part of a current from the differential output of the second multiplier circuit with at least part of a current from the differential output of the first transconductance circuit, and
the second differential load is configured to sum at least part of a current from the differential output of the first multiplier circuit with at least part of a current from the differential output of the second transconductance circuit.

14. A phase error compensation circuit configured to generate a phase-corrected quadrature Q output signal and a corresponding phase-corrected in-phase I output signal, the circuit comprising:
a first transconductance circuit configured to convert a voltage signal related to an I input voltage signal to an I current signal;
a second transconductance circuit configured to convert a voltage signal related to a Q input voltage signal to a Q current signal;
a second multiplier circuit configured to multiply the Q current signal times a Q scaling constant to provide a scaled Q signal;
a first multiplier circuit configured to multiply the I current signal provided by the first transconductance circuit times an I scaling constant at a control input of the first multiplier circuit to provide a scaled I signal;
an I summer configured to sum the I current signal with the scaled Q signal; and
a Q summer configured to sum the Q current signal with the scaled I signal.

15. The phase error compensation circuit of claim 14, wherein the first and second transconductance circuits, the first and second multiplier circuits, and the I and Q summer are configured to operate on differential signals.

16. A method of compensating for a phase error in a circuit comprising a first and second transconductance circuit, a first and second multiplier circuit, and a first and second load, the method comprising:
converting an in-phase I voltage signal to an I current signal by the first transconductance circuit;
converting a quadrature Q voltage signal to a Q current signal by the second transconductance circuit;
multiplying, by the first multiplier circuit, the Q current signal times a Q scaling constant to provide a scaled Q signal;
multiplying, by the second multiplier circuit, the I current signal at a control input of the first multiplier circuit times an I scaling constant provided by the first transconductance circuit to provide a scaled I signal;
summing the I current signal with the scaled Q signal by the first load; and
summing the Q current signal with the scaled I signal by the second load.

17. The method of claim 16, wherein each step is performed differentially.

18. The method of claim 16, wherein at least one of (i) the I scaling constant and (ii) the Q scaling constant is substantially less than one.

19. The method of claim 16, further comprising generating a phase-corrected Q and I signals at a frequency of at least 1 GHz.

20. A phase error compensation circuit comprising:
- a first transconductance circuit having a differential input and a differential output;
- a second transconductance circuit having a differential input and a differential output;
- a first multiplier circuit comprising:
  - a differential control input ($V_{CI}$);
  - a second differential input coupled to the differential output of the first transconductance circuit; and
  - a differential output;
- a second multiplier circuit comprising:
  - a differential control input ($V_{CQ}$);
  - a second differential input coupled to the differential output of the second transconductance circuit; and
  - a differential output;
- a first differential load comprising a first load and a second load, together having a differential input coupled to the differential output of the second multiplier circuit and sharing a common node; and
- a second differential load comprising a first load and a second load together having a differential input coupled to the differential output of the first multiplier circuit and sharing the common node, wherein:
  - the first multiplier circuit comprises:
    - a first pair of transistors having a common node coupled to a first component of the differential output of the first transconductance circuit; and
    - a second pair of transistors having a common node coupled to a second component of the differential output of the first transconductance circuit;
  - the second multiplier circuit comprises:
    - a first pair of transistors having a common node coupled to a first component of the differential output of the second transconductance circuit; and
    - a second pair of transistors having a common node coupled to a second component of the differential output of the second transconductance circuit; and
  - a first transistor of the first pair of transistors and a second transistor of the second pair of transistors of the first multiplier are coupled to a common bias node; and
  - a first transistor of the first pair of transistors and a second transistor of the second pair of transistors of the second multiplier are coupled to the common bias node.

* * * * *